(12) United States Patent
Jiang et al.

(10) Patent No.: US 10,129,990 B2
(45) Date of Patent: Nov. 13, 2018

(54) MIDDLE FRAME OF MOBILE TERMINAL AND MOBILE TERMINAL

(71) Applicant: Beijing Xiaomi Mobile Software Co., Ltd., Beijing (CN)

(72) Inventors: Zhongsheng Jiang, Beijing (CN); Dan Liu, Beijing (CN); Guosheng Li, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 15/494,597

(22) Filed: Apr. 24, 2017

(65) Prior Publication Data

US 2017/0318698 A1 Nov. 2, 2017

(30) Foreign Application Priority Data

Apr. 29, 2016 (CN) .......................... 2016 1 0282788

(51) Int. Cl.
*H05K 7/02* (2006.01)
*H05K 7/04* (2006.01)
(Continued)

(52) U.S. Cl.
CPC .......... *H05K 5/0217* (2013.01); *H04M 1/026* (2013.01); *H04M 1/185* (2013.01); *H04M 2250/22* (2013.01)

(58) Field of Classification Search
CPC .... H05K 5/0217; H04M 1/026; H04M 1/185; H04M 2250/22
(Continued)

(56) References Cited

U.S. PATENT DOCUMENTS 2,724,047 A * 11/1955 Zurawski .................. F21S 8/04
362/260
8,517,172 B1 8/2013 Chang
(Continued)

FOREIGN PATENT DOCUMENTS

CN 103415174 A 11/2013
CN 203433482 U 2/2014
(Continued)

OTHER PUBLICATIONS

English version of International Search Report of PCT/CN2016/094342, mailed from the State Intellectual Property Office of China dated Dec. 29, 2016.
(Continued)

*Primary Examiner* — Hung S Bui
(74) *Attorney, Agent, or Firm* — Finnegan, Henderson, Farabow, Garrett & Dunner LLP (57) ABSTRACT

The present disclosure relates to a mobile terminal and a middle frame of the mobile terminal. The middle frame includes: a metallic baffle having a first long side and a second long side; a first non-metallic side plate, a long side of the first non-metallic side plate connected to the first long side of the metallic baffle; and a second non-metallic side plate, a long side of the second non-metallic side plate connected to the second long side of the metallic baffle. The first non-metallic side plate and the second non-metallic side plate are positioned at a same face of the metallic baffle and are perpendicular to the same face of the metallic baffle.

12 Claims, 5 Drawing Sheets

(51) Int. Cl.
*H05K 5/02* (2006.01)
*H04M 1/02* (2006.01)
*H04M 1/18* (2006.01)

(58) Field of Classification Search
USPC ........................................ 361/807, 809, 810
See application file for complete search history.

(56) References Cited

U.S. PATENT DOCUMENTS

| | | | |
|---|---|---|---|
| 9,894,192 B2* | 2/2018 | Cox, III | H04M 1/185 |
| 2007/0139901 A1* | 6/2007 | McGregor | H05K 1/162 |
| | | | 361/760 |
| 2012/0133608 A1 | 5/2012 | Chen | |
| 2012/0234791 A1 | 9/2012 | Weber et al. | |
| 2015/0227227 A1 | 8/2015 | Myers et al. | |

FOREIGN PATENT DOCUMENTS

| | | |
|---|---|---|
| CN | 204168352 U | 2/2015 |
| CN | 204291096 U | 4/2015 |
| CN | 104850183 A | 8/2015 |
| CN | 105188291 A | 12/2015 |
| EP | 2176049 A2 | 4/2010 |
| EP | 2742674 A1 | 6/2014 |
| JP | 2016-46601 A | 4/2016 |
| RU | 155093 U1 | 9/2015 |
| RU | 2577185 C2 | 3/2016 |

OTHER PUBLICATIONS

Extended European Search Report for European Application No. 16198912.4, mailed from the European Patent Office, dated Apr. 12, 2017.

Office Action issued in Russian Patent Application No. 2016145112/07(072446), mailed from Patent Office the Russian Federation, dated Dec. 12, 2017.

International Search Report of PCT/CN2016/094342, mailed from the State Intellectual Property Office of China dated Dec. 29, 2016.

* cited by examiner

Prior Art

MIDDLE FRAME OF MOBILE TERMINAL AND MOBILE TERMINAL

CROSS-REFERENCE TO RELATED APPLICATIONS

The present application is based upon and claims priority to Chinese patent application No. 201610282788.9, filed Apr. 29, 2016, the entire contents of which are incorporated herein by reference.

TECHNICAL FIELD

The disclosure relates generally to the art of mobile terminals and, more particularly, to a mobile terminal and a middle frame of the mobile terminal.

BACKGROUND

With the development of terminal technology, screen sizes of the mobile terminals have become larger and larger, and edge touch control has become more and more popular. The edge touch control is usually activated by a touch control signal, which is generated by a touch sensor of the mobile terminal detecting a touch, and the strength of the touch control signal is associated with a middle frame of the mobile terminal, hereinafter also referred to as a "mobile terminal middle frame" or simply a "middle frame." The middle frame refers to a structure in the mobile terminal for separating a touch control assembly and a battery of the mobile terminal, where the touch sensor is included in the touch control assembly.

Figure 1:
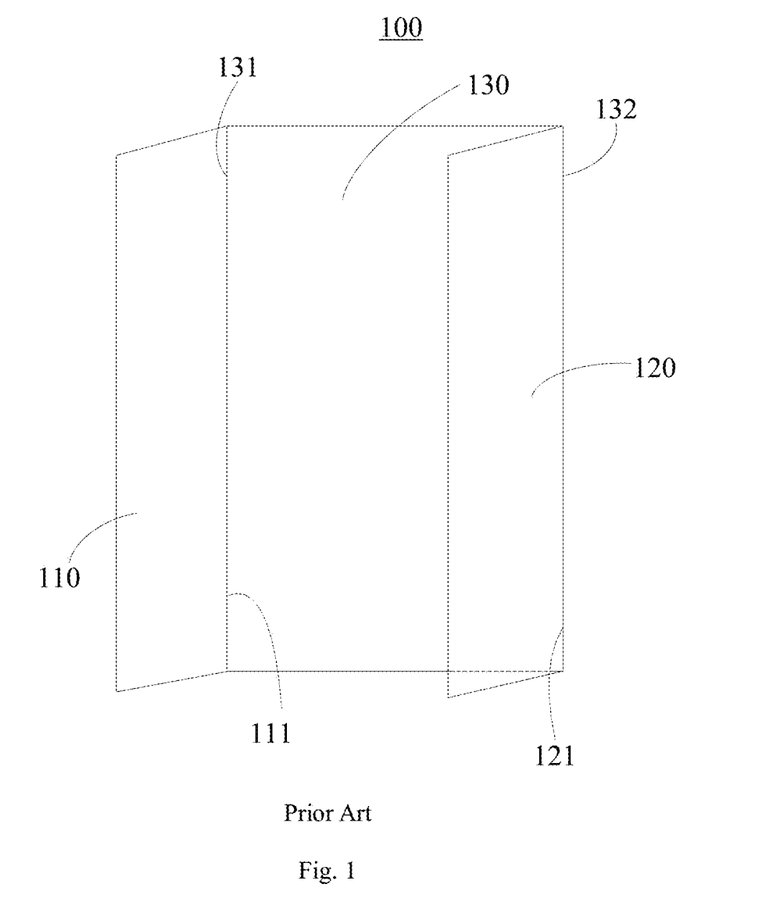
FIG. 1 is a schematic structural view showing a metallic middle frame according to conventional technologies.

In the conventional technology, to prevent a static current generated at the battery side from entering the touch control assembly and causing undesirable effects on the touch control assembly, a metallic middle frame is commonly adopted for mobile terminals. FIG. 1 shows a conventional metallic middle frame 100 including a first metallic side plate 110, a second metallic side plate 120, and a metallic baffle 130. As shown in FIG. 1, a long side 111 of the first metallic side plate 110 and a first long side 131 of the metallic baffle 130 are connected to each other. A long side 121 of the second metallic side plate 120 and a second long side 132 of the metallic baffle 130 are connected to each other. Further, the first metallic side plate 110 and the second metallic side plate 120 are positioned at a same face of the metallic baffle 130 and are respectively perpendicular to the metallic baffle 130.

SUMMARY

According to a first aspect of the present disclosure, there is provided a middle frame comprising: a metallic baffle having a first long side and a second long side; a first non-metallic side plate, a long side of the first non-metallic side plate connected to the first long side of the metallic baffle; and a second non-metallic side plate, a long side of the second non-metallic side plate connected to the second long side of the metallic baffle, wherein the first non-metallic side plate and the second non-metallic side plate are positioned at a same face of the metallic baffle and are perpendicular to the same face of the metallic baffle.

According to a second aspect of the present disclosure, there is provided a middle frame comprising: a metallic baffle having a first long side and a second long side; a first side plate including: a first metallic portion having a long side connected to the first long side of the metallic baffle; and a first non-metallic portion connected to another long side of the first metallic portion opposite to the long side of the first metallic portion; and a second side plate including: a second metallic portion having a long side connected to the second long side of the metal baffle; and a second non-metallic portion connected to another long side of the second metallic portion opposite to the long side of the second metallic portion.

According to a third aspect of the present disclosure, there is provided a mobile terminal comprising: a middle frame including: a metallic baffle having a first long side and a second long side; a first side plate including: a first metallic portion having a long side connected to the first long side of the metallic baffle; and a first non-metallic portion connected to another long side of the first metallic portion opposite to the long side of the first metallic portion; and a second side plate including: a second metallic portion having a long side connected to the second long side of the metal baffle; and a second non-metallic portion connected to another long side of the second metallic portion opposite to the long side of the second metallic portion. The mobile terminal further comprises at least one sensor at least partially provided in the first non-metallic portion and the second non-metallic portion of the middle frame.

It is to be understood that both the foregoing general description and the following detailed description are exemplary and explanatory only and are not restrictive of the disclosure.

BRIEF DESCRIPTION OF THE DRAWINGS

The accompanying drawings, which are incorporated herein and constitute a part of this specification, illustrate embodiments consistent with the disclosure and, together with the description, serve to explain the principles of the disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of devices and methods consistent with some aspects related to the invention as recited in the appended claims.

As described above in the Background section, the screen size of mobile terminals has become larger and larger. Although a large screen can provide larger operation space and viewing area for a user, it makes it more difficult to operate the mobile terminal using one hand. To solve this problem, edge touch control is added to some mobile terminals. The edge touch control is activated by a touch control signal obtained through the detection of a touch by a touch sensor in a touch control assembly of the mobile terminal. To prevent a static current generated at the battery side from entering the touch control assembly, a metallic middle frame is commonly adopted for mobile terminals. However, because the metallic middle frame can shield a part of the touch control signal, the efficiency and accuracy of a gathered touch control signal can be decreased. The present disclosure provides a middle frame configured to allow the mobile terminal to gather a touch control signal having improved efficiency and accuracy.

Figure 2:
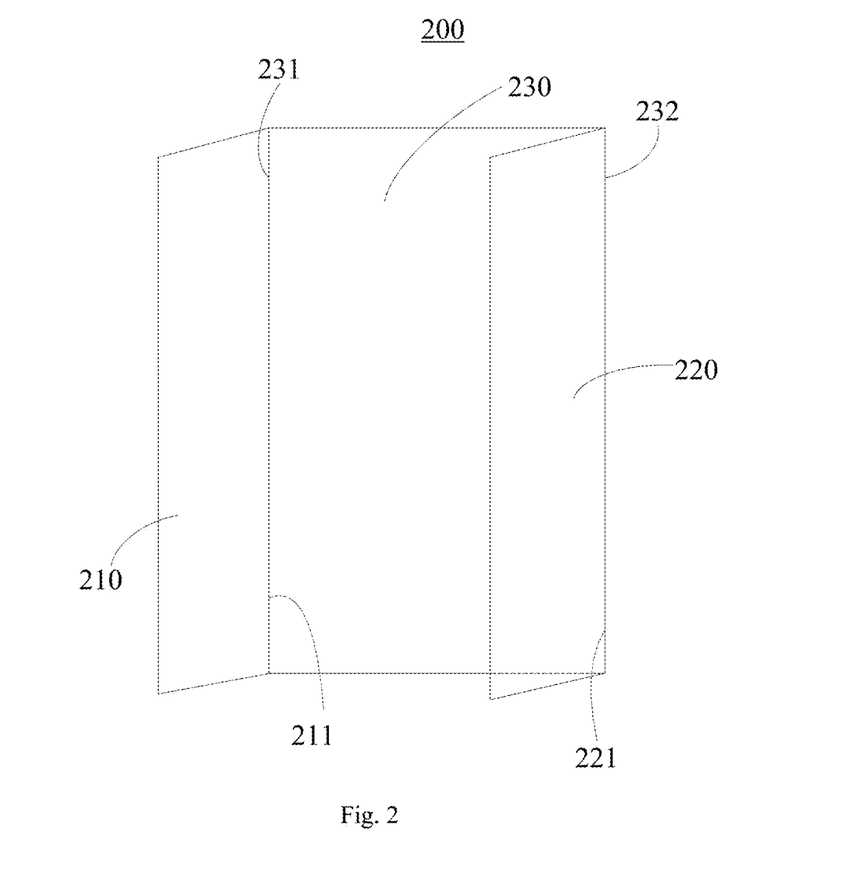
FIG. 2 is a schematic structural view showing a middle frame according to an exemplary embodiment.

FIG. 2 is a schematic structural view showing a middle frame 200 of a mobile terminal according to an exemplary embodiment. As show in FIG. 2, the middle frame 200 includes a first non-metallic side plate 210 having a long side 211, a second non-metallic side plate 220 having a long side 221, and a metallic baffle 230 having a first long side 231 and a second long side 232. The long side 211 of the first non-metallic side plate 210 and the first long side 231 of the metallic baffle 230 are connected to each other. The long side 221 of the second non-metallic side plate 220 and the second long side 232 of the metallic baffle 230 are connected to each other. The first non-metallic side plate 210 and the second non-metallic side plate 220 are positioned at a same face of the metallic baffle 230 and are respectively perpendicular to the same face of the metallic baffle 230.

According to the present disclosure, both side plates 210 and 220 of the middle frame 200 are non-metallic, thus when the mobile terminal is gathering the touch control signal, the shielding effect of the first non-metallic side plate 210 and second non-metallic side plate 220 on the touch control signal is decreased as compared to a middle frame including metallic side plates. Therefore, the mobile terminal can more easily gather the touch control signal, and the efficiency and accuracy in gathering the touch control signal is improved.

In some embodiments, the first non-metallic side plate 210 and/or the second non-metallic side plate 220 can be formed by an injection-molding material, or another non-metallic material, such as, for example, ceramics or glass.

In the embodiment described above, the first non-metallic side plate 210 and the second non-metallic side plate 220 are perpendicular to the metallic baffle 230. In some embodiments, one or both of the first and second non-metallic side plates 210 and 220 are not perpendicular to the metallic baffle 230. The embodiments of the present disclosure are not limited to this.

Figure 3:
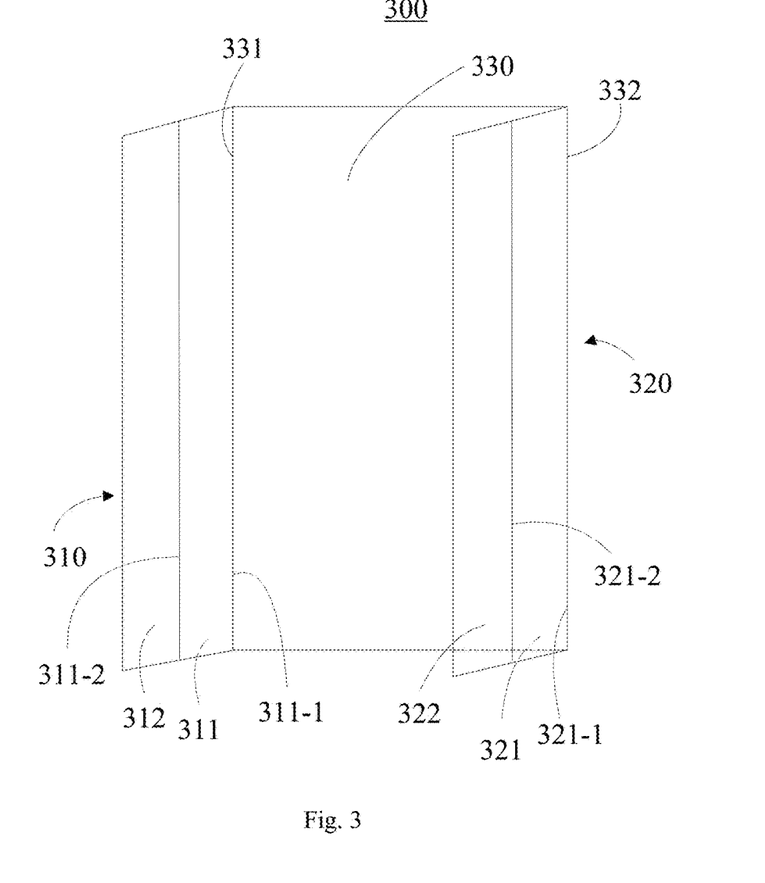
FIG. 3 is a structural schematic view showing a middle frame according to another exemplary embodiment.

FIG. 3 is a schematic structural view showing another middle frame 300 of a mobile terminal according to an exemplary embodiment. As shown in FIG. 3, the middle frame 300 includes a first side plate 310 including a first metallic portion 311 and a first non-metallic portion 312, a second side plate 320 including a second metallic portion 321 and a second non-metallic portion 322, and a metallic baffle 330.

A long side 311-1 of the first metallic portion 311 and a first long side 331 of the metallic baffle 330 are connected to each other. Another long side 311-2 of the first metallic portion 311 opposite the long side 311-1 of the first metallic portion 311 is connected to the first non-metallic portion 312. A long side 321-1 of the second metallic portion 321 and a second long side 332 of the metallic baffle 330 are connected to each other. Another long side 321-2 of the second metallic portion 321 opposite the long side 321-1 of the second metallic portion 321 is connected to the second non-metallic portion 322.

According to the present disclosure, the first side plate 310 includes the first non-metallic portion 312, which is positioned at the side opposite the long side 311-1 of the first metallic portion 311 that is connected to the metallic baffle 330. Further, the second side plate 320 includes the second non-metallic portion 322, which is positioned at the side opposite the long side 321-1 of the second metallic portion 321 that is connected to the metallic baffle 330. That is, the first and second non-metallic portions 312 and 322 are positioned away, i.e., at a certain distance, from the metallic baffle 330. Thus, when the mobile terminal is gathering a touch control signal, the shielding effect of the first side plate 310 and the second side plate 320 on the touch control signal is decreased. Therefore, the mobile terminal can more easily gather the touch control signal, and the efficiency in gathering the touch control signal is improved. Further, because the first and second side plates 310 and 320 include the first and second metallic portions 311 and 321, respectively, the first side plate 310 and the second side plate 320 not only can ensure a sturdy structure for the middle frame 300, but also can effectively prevent a static current generated at a battery side of the mobile terminal from entering a touch control assembly of the mobile terminal, so as to improve the accuracy in gathering the touch control signal.

In some embodiments, the first metallic portion 311 and the first non-metallic portion 312 are in a same plane, and the second metallic portion 321 and the second non-metallic portion 322 are in another same plane.

In some embodiments, each of the first and second non-metallic portions 312 and 322 can be formed by a non-metallic material, such as, for example, an injection-molding material, ceramic, or glass.

As shown in FIG. 3, each of the first metallic portion 311, the first non-metallic portion 312, the second metallic portion 321, and the second non-metallic portion 322, when their respective thicknesses are considered, is a cuboid side plate. This simplifies the installation of the middle frame 300, and improves the appearance of the mobile terminal having the middle frame 300. In some embodiments, one or more of the first metallic portion 311, the first non-metallic portion 312, the second metallic portion 321, and the second non-metallic portion 322 can have a shape other than a cuboid shape.

Figure 4:
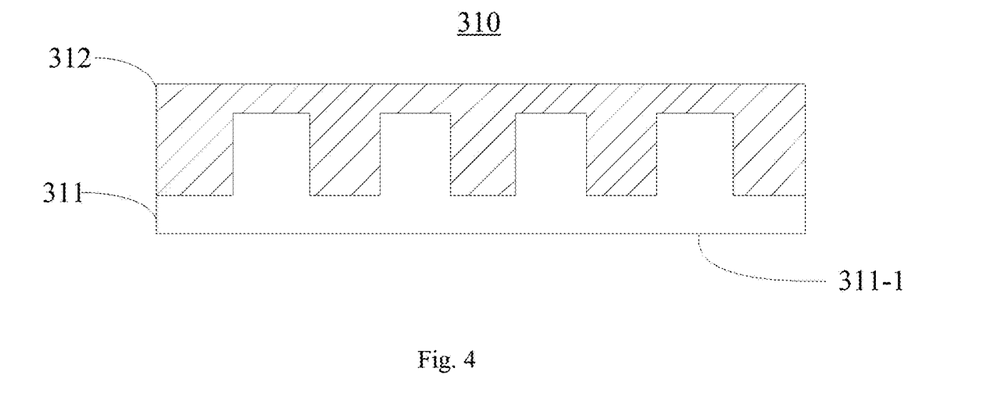
FIG. 4 is a side view showing a first side plate according to an exemplary embodiment.

FIG. 4 is a side view showing an example of the first side plate 310 according to an exemplary embodiment. As shown in FIG. 4, each of the first metallic portion 311 and the first non-metallic portion 312 need not be rectangular, as diagrammatically shown in FIG. 3. In the example shown in FIG. 4, the first metallic portion 311 includes at least one groove structure, the first non-metallic portion 312 includes at least one protrusion structure, and the at least one protrusion structure of the first non-metallic portion 312 is imbedded in the at least one groove structure of the first metallic portion 311. With such a first side plate 310 shown in FIG. 4, the middle frame 300 has a sturdy structure, and elements of the mobile terminal having the middle frame 300 can be more stably fixed in the mobile terminal.

As shown in FIG. 4, the at least one groove structure has a rectangular shape. In some embodiments, the at least one groove structure has another shape, such as a zigzag shape or a wave-like shape. Similarly, the at least one protrusion structure as shown in FIG. 4 also has a rectangular shape. In some embodiments, the at least one protrusion structure has another shape, such as a zigzag shape or a wave-like shape.

Figure 5:
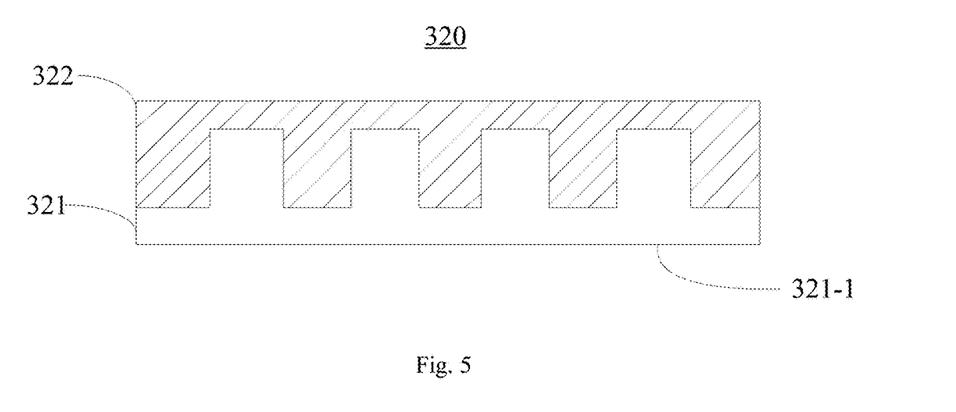
FIG. 5 is a side view showing a second side plate according to an exemplary embodiment.

FIG. 5 is a side view showing an example of the second side plate 320 according to an exemplary embodiment. As shown in FIG. 5, each of the second metallic portion 321 and the second non-metallic portion 322 need not be rectangular, as diagrammatically shown in FIG. 3. In the example shown in FIG. 5, the second metallic portion 321 includes at least one groove structure, the second non-metallic portion 322 includes at least one protrusion structure, and the at least one protrusion structure of the second non-metallic portion 322 is imbedded in the at least one groove structure of the second metallic portion 321. Similar to the first side plate 310 shown in FIG. 4, the second side plate 320 shown in FIG. 5 improves the structural sturdiness of the middle frame 300. Further, elements of the mobile terminal having the middle frame 300 can be more stably fixed in the mobile terminal.

As shown in FIG. 5, the at least one groove structure has a rectangular shape. In some embodiments, the at least one groove structure has another shape, such as a zigzag shape or a wave-like shape. Similarly, the at least one protrusion structure as shown in FIG. 5 also has a rectangular shape. In some embodiments, the at least one protrusion structure has another shape, such as a zigzag shape or a wave-like shape.

Figure 6:
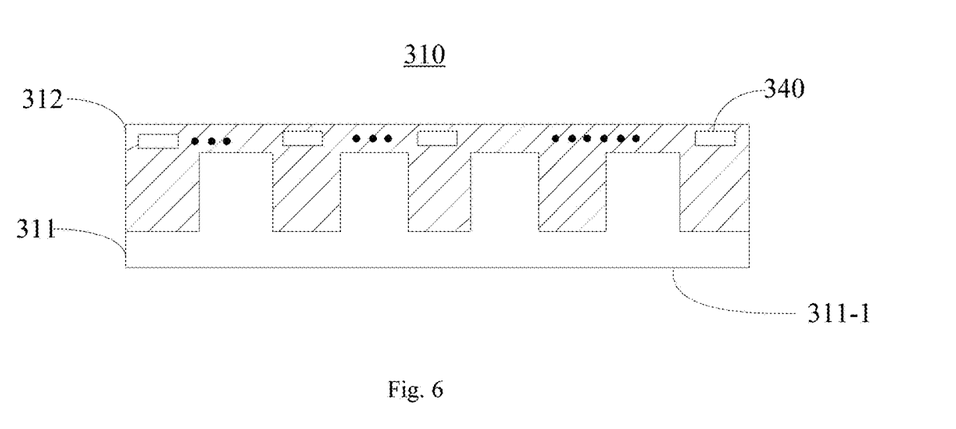
FIG. 6 is a side view showing a first side plate according to another exemplary embodiment.
Figure 7:
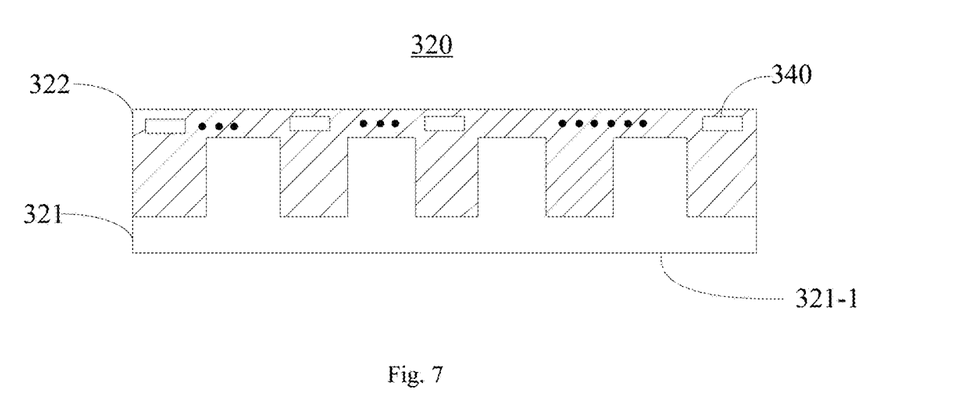
FIG. 7 is a side view showing a second side plate according to another exemplary embodiment.

FIG. 6 is a side view showing another example of the first side plate 310 according to another exemplary embodiment. Similarly, FIG. 7 is a side view showing another example of the second side plate 320 according to another exemplary embodiment. In the example shown in FIG. 6, openings for accommodating touch sensors 340 of the mobile terminal are formed in the first non-metallic portion 312. The touch sensors 340 are positioned at the openings in the first non-metallic portion 312. For example, at least a portion of each of the touch sensors 340 is inserted in the corresponding opening in the first non-metallic portion 312. Further, each of the at least one groove structure of the first metallic portion 311 corresponds to and, with the orientation shown in FIG. 6, is positioned below one of the openings for the touch sensors 340.

Correspondingly, in the example shown in FIG. 7, openings for accommodating the touch sensors 340 of the mobile terminal are formed in the second non-metallic portion 322. The touch sensors 340 are positioned at the openings in the second non-metallic portion 322. For example, at least a portion of each of the touch sensors 340 is inserted in the corresponding opening in the second non-metallic portion 322. Further, each of the at least one groove structure of the second metallic portion 321 corresponds to and, with the orientation shown in FIG. 7, is positioned below one of the openings for the touch sensors 340.

As shown in FIGS. 6 and 7, the touch sensors 340 are positioned in the first and second non-metallic portions 312 and 322, and relatively distant from the first and second metallic portions 311 and 321. As a result, the shielding of the touch control signal caused by the first metallic portion 311 and/or the second metallic portion 321 can be decreased. Therefore, the mobile terminal can more efficiently gather the touch control signal.

According to the present disclosure, the first and second metallic portions 311 and 321 and the first and second non-metallic portions 312 and 322 can have shapes different from those shown in FIGS. 4-7, and the positional relationship between the portions 311, 312, 321, and 322 and the touch sensors 340 can be different from that shown in FIGS. 6 and 7, as long as the touch sensors 340 are relatively close to the first non-metallic portion 312 and/or the second non-metallic portion 322 and are relatively distant from the first metallic portion 311 and/or the second metallic portion 321.

Figure 8:
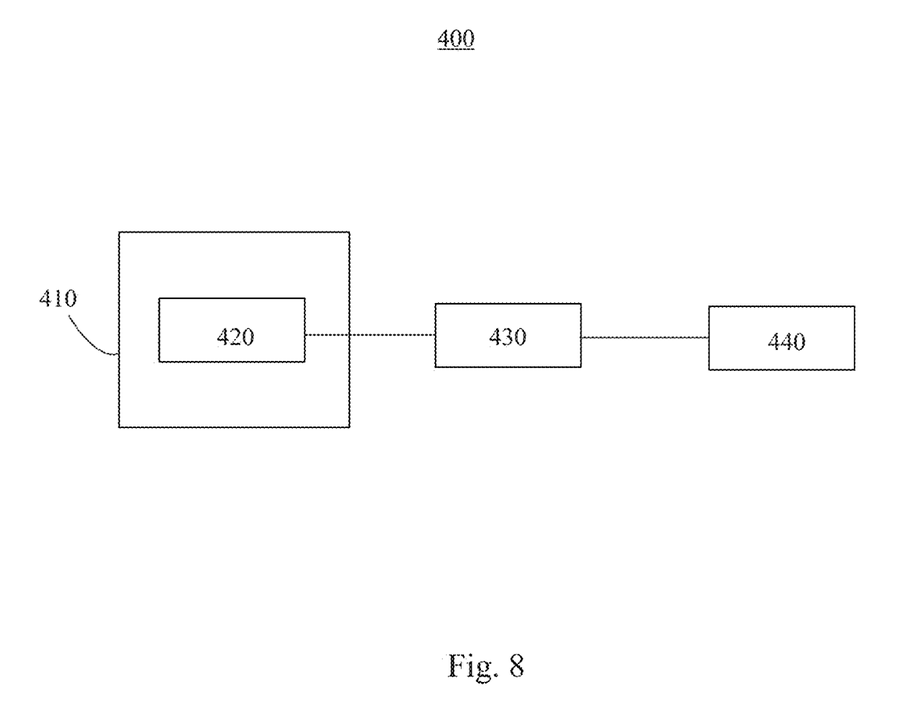
FIG. 8 is a block diagram of a mobile terminal according to an exemplary embodiment.

FIG. 8 is a block diagram of a mobile terminal 400 according to an exemplary embodiment. Referring FIG. 8, the mobile terminal 400 includes a middle frame 410 consistent with the present disclosure, such as one of the exemplary middle frames described above. The mobile terminal 400 further includes one or more touch sensors 420 consistent with the present disclosure, such as the exemplary touch sensors described above. For example, the one or more touch sensors 420 are positioned on the middle frame 410. The mobile terminal 400 further includes one or more of other elements, such as, a processor 430 and an antenna 440.

Other embodiments of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the following claims.

According to the present disclosure, a middle frame for a mobile terminal includes first and second side plates at least partially formed of a non-metallic material. The shielding effect of the first and second side plates on a touch control signal is decreased as compared to metallic side plates formed entirely of a metallic material. Therefore, when the mobile terminal is gathering the touch control signal, the touch control signal can be more easily gathered, and the efficiency and accuracy in gathering the touch control signal can be improved. Further, in the embodiments where one or both of the first and second side plates include both a metallic portion and a non-metallic portion, the first and/or second side plate can provide a sturdy structure to the middle frame and can effectively prevent a static current generated at the battery side from entering a touch control assembly. As such, the accuracy for gathering the touch control signal can be further improved.

It will be appreciated that the present disclosure is not limited to the exact examples that have been described above and illustrated in the accompanying drawings, and that various modifications and changes can be made without departing from the scope thereof. It is intended that the scope of the invention should only be limited by the appended claims.

What is claimed is:
1. A middle frame comprising:
a metallic baffle having a first long side and a second long side;
a first side plate including:
a first metallic portion having a long side connected to the first long side of the metallic baffle; and
a first non-metallic portion connected to another long side of the first metallic portion opposite to the long side of the first metallic portion; and
a second side plate including:
a second metallic portion having a long side connected to the second long side of the metal baffle; and
a second non-metallic portion connected to another long side of the second metallic portion opposite to the long side of the second metallic portion.

2. The middle frame according to claim 1, wherein each of the first metallic portion and the first non-metallic portion has a cuboid shape.

3. The middle frame according to claim 2, wherein each of the second metallic portion and the second non-metallic portion has a cuboid shape.

4. The middle frame of mobile terminal according to claim 2, wherein:
the second metallic portion includes at least one groove structure,
the second non-metallic portion includes at least one protrusion structure, and
the at least one protrusion structure of the second non-metallic portion is imbedded in the at least one groove structure of the second metallic portion.

5. The middle frame according to claim 1, wherein each of the second metallic portion and the second non-metallic portion has a cuboid shape.

6. The middle frame according to claim 1, wherein:
the first metallic portion includes at least one groove structure,
the first non-metallic portion includes at least one protrusion structure, and
the at least one protrusion structure of the first non-metallic portion is imbedded in the at least one groove structure of the first metallic portion.

7. The middle frame according to claim 6, wherein:
the second metallic portion includes at least one groove structure,
the second non-metallic portion includes at least one protrusion structure, and
the at least one protrusion structure of the second non-metallic portion is imbedded in the at least one groove structure of the second metallic portion.

8. The middle frame according to claim 7, wherein:
the first non-metallic portion has at least one opening for accommodating at least one touch sensor, each of the at least one groove structure of the first metallic portion is positioned corresponding to one of the at least one opening in the first non-metallic portion, and
the second non-metallic portion has at least one opening for accommodating the at least one touch sensor, each of the at least one groove structure of the second metallic portion is positioned corresponding to one of the at least one opening in the second non-metallic portion.

9. The middle frame according to claim 6, wherein:
the first non-metallic portion has at least one opening for accommodating at least one touch sensor, each of the at least one groove structure of the first metallic portion is positioned corresponding to one of the at least one opening in the first non-metallic portion.

10. The middle frame according to claim 1, wherein:
the second metallic portion includes at least one groove structure,
the second non-metallic portion includes at least one protrusion structure, and
the at least one protrusion structure of the second non-metallic portion is imbedded in the at least one groove structure of the second metallic portion.

11. The middle frame according to claim 10, wherein:
the second non-metallic portion has at least one opening for accommodating at least one touch sensor, each of the at least one groove structure of the second metallic portion is positioned corresponding to one of the at least one opening in the second non-metallic portion.

12. A mobile terminal, comprising:
a middle frame including:
a metallic baffle having a first long side and a second long side;
a first side plate including:
a first metallic portion having a long side connected to the first long side of the metallic baffle; and
a first non-metallic portion connected to another long side of the first metallic portion opposite to the long side of the first metallic portion; and
a second side plate including:
a second metallic portion having a long side connected to the second long side of the metal baffle; and
a second non-metallic portion connected to another long side of the second metallic portion opposite to the long side of the second metallic portion; and
at least one sensor at least partially provided in the first non-metallic portion and the second non-metallic portion of the middle frame.

* * * * *